US006238812B1

(12) United States Patent
Brown et al.

(10) Patent No.: US 6,238,812 B1
(45) Date of Patent: May 29, 2001

(54) ISOTOPIC SEMICONDUCTOR BATTERIES

(76) Inventors: Paul M. Brown, 9510 Sunflower La., Boise, ID (US) 83704; Patrick G. Herda, 5555 S. Quintera Way, Aurora, CO (US) 80015

( * ) Notice: Subject to any disclaimer, the term of this patent is extended or adjusted under 35 U.S.C. 154(b) by 0 days.

(21) Appl. No.: 09/055,462

(22) Filed: Apr. 6, 1998

(51) Int. Cl.[7] .......... H01M 14/00; H01L 31/04
(52) U.S. Cl. .......... 429/5; 310/302; 310/303
(58) Field of Search .......... 429/5; 310/303

(56) References Cited

U.S. PATENT DOCUMENTS

| | | | | |
|---|---|---|---|---|
| 3,257,570 | | 6/1966 | Dahmelt et al. | 310/303 |
| 3,344,289 | | 9/1967 | Knight | 310/303 |
| 3,706,893 | * | 12/1972 | Olsen | 310/3 |
| 3,898,994 | * | 8/1975 | Kolenik | 128/419 |
| 4,967,112 | | 10/1990 | Day | 310/304 |
| 5,087,533 | | 2/1992 | Brown | 429/5 |
| 5,246,505 | | 9/1993 | Mowery, Jr. | 136/202 |
| 5,280,213 | | 1/1994 | Day | 310/302 |
| 5,605,171 | | 2/1997 | Tam | 136/253 |
| 5,606,213 | | 2/1997 | Kherani et al. | 310/303 |
| 5,616,928 | | 4/1997 | Russell et al. | 250/515.1 |
| 5,642,014 | | 6/1997 | Hiilenius | 310/303 |
| 5,770,988 | | 6/1998 | Goto et al. | 333/236 |
| 5,859,484 | | 1/1999 | Mannik et al. | 310/303 |

* cited by examiner

*Primary Examiner*—Gabrielle Brouillette
*Assistant Examiner*—Mark Ruthkosky
(74) *Attorney, Agent, or Firm*—Ken J. Pedersen; Barbara S. Pedersen

(57) ABSTRACT

A semiconducter battery that utilizes radioactive decay processes to produce electrical power by direct electrical current generation from these decay products. These batteries have extremely long half-lives. Each decay can produce on the order of 1,500,000 free electrons and 1,500,000 ions per each radioactive decay, so there is a tremendous multiplication factor for current generation. Production of these batteries by semiconductor processes greatly reduces battery cost compared to existing batteries that utilize radioactive decays. The battery comprises a n-type semiconducter layer, a radioactive semiconducter layer sandwiched between two adjacent layers of semiconducter material not containing radioactive material, and a p-type semiconducter layer.

3 Claims, 3 Drawing Sheets

ISOTOPIC SEMICONDUCTOR BATTERIES

TECHNICAL FIELD OF THE INVENTION

This invention relates in general to batteries and relates more particularly to batteries that are powered by direct conversion of the energy of radioactive decay processes into stored electrical energy without going through a thermal cycle. Because the decay lifetimes of these nuclear decay processes can be thousands of years, these batteries will exhibit comparable useful lifetimes.

BACKGROUND ART

A conventional battery, such as a conventional chemical car battery, contains: a first set of electrodes of a first material; a second set of electrodes of a second material; and an acidic fluid in which these two electrodes are immersed to produce an electrical path between these two electrodes. These two sets of electrodes are selected to have significantly different electrochemical work functions $W_1$ and $W_2$, so that, when an external current path is provided between these two electrodes, a current is produced from the first electrode, through this external conductive path to the second electrode. This type of battery provides a peak voltage that is substantially equal to the difference between the electrochemical potentials of these two electrodes. The lifetime of conventional batteries is relatively short, because chemical energies are relatively small. Therefore, cars include generators that are powered by means of a first fan belt that is driven by the car's gasoline motor. These generators are connected to the battery by electrical leads that maintain the battery's stored chemical energy.

Many applications require batteries that have extremely long lifetimes. For example, space probes that will travel for many years before reaching their destinations, need to utilize batteries that have extremely long lifetimes. Similarly, many devices, such as computers, are connected to power sources that are designed to protect that device from power spikes in power lines to which these devices are connected. These devices also typically include batteries that contain at least enough stored energy that the computer has time to shut down in a manner that saves unstored data that has been keyed into this computer. It would be advantageous for these devices to have enough stored energy to power the computer for a day or even a few days which should be sufficiently long for the power company to correct its power distribution problem. These batteries would also be useful in smoke detectors, so that lives are not put at risk because the smoke detector's batteries lost their stored electrochemical energy. It is of crucial importance to have extremely long life batteries in space probes and any other application in which it is difficult or impossible to replace the batteries. However, even in applications in which it is merely inconvenient to have a battery go dead, it is advantageous to have long-life batteries, because such batteries need be replaced only at very long intervals.

FIG. 1 illustrates a battery 10 that is taught in U.S. Pat. No. 5,087,533 by Paul M. Brown, entitled *Contact Potential Difference Celle* that was issued on Feb. 11, 1992. Battery 10 contains: (1) a first electrode 11 that has a first work function $W_1$; (2) a second electrode 12 that has a second work function $W_2$ that is larger than $W_1$, and (3) two or more nonconductive spacers 13 that keep electrodes 11 and 12 at a fixed spacing to produce a cavity 14 in which a gas or solid is ionized by a flux of radiation that has sufficient energy to ionize molecules or atoms in this radioactive material. This radiation flux can be provided by a variety of sources, such as a nuclear reactor, an external block of radioactive material or radioactive material within this battery. This radioactive material can be provided in several forms, such as: a gas, a liquid, a gel or a solid.

Because the work function of electrode 12 is larger than the work function of electrode 11, when one or more electric conductors 15 are connected between electrode 11 and electrode 12, a negative charge is produced on electrode 11 and an equal positive charge is produced on electrode 12. The resulting electropotential difference between these two electrodes is equal to the difference between the work functions of these two electrodes. This electropotential difference produces an electric field $\vec{E}$ that extends from electrode 12 to electrode 11. Free electrons and negative ions in cavity 14 are drawn toward the more lectropositive electrode (i.e., electrode 11) and the positive ions are drawn toward the more lectronegative electrode (i.e., electrode 12). The total current I between electrodes 11 and 12 is the sum of the electron current $I_e$ and the total ion currents $I_i$.

This current flux experiences negligible resistance within the battery, because the density of ions and free electrons within cavity 14 is so low, that there is negligible scattering among these electrons and free ions. The small number of collisions between the electrons, ions and neutral particles in cavity 14 produces an extremely low level of excited states that can radiate away small amounts of energy. Therefore, resistive losses are extremely small compared to resistive losses in conventional batteries. Thus, these batteries not only exhibit extremely long half-lives (e.g., 458 years for Americium-241), they also exhibit extremely low heat dissipation rates. When a radioactive gas is supplied to cavity 14, the resulting positive and negative ions injected into the cavity by radioactive decays have sufficient energy to ionize a significant fraction of the gas ions within this cavity. Because the radioactive decay energies are typically on the order of millions of electron volts, the energy needed to ionize an atom that is impacted by a radioactive decay product is only a few electron volts (on the order of 32 eV), each radioactive ion can ionize on the order of a million gas molecules. This battery therefore exhibits an incredibly long lifetime, compared to electrochemical batteries.

Unfortunately, the metallic electrodes in this prior art battery are bulky, which significantly reduces this battery's efficiency and increases its weight. In addition, its design is not amenable to the integrated circuit processes that enable the manufacture of circuits to be produced in small size and/or to be produced inexpensively by these integrated circuit processes.

FIG. 2 illustrates a prior art battery 20 that consists of a series stack of N (=7) battery cells 10 of the type presented in FIG. 1. Battery 20 therefore provides a potential difference of $N \cdot (W_1 - W_2)$ across a resistor 21 of resistance R. Each of battery cells 10 exhibits an inherent resistance r, so the total resistance of the closed conductive path from the top of layer 11, through layers 12 and 13 back to the top of layer 11 is $N \cdot r + R$. Therefore, the current I in this closed circuit is equal to $N \cdot (W_1 - W_2)/(N \cdot r + R)$.

U.S. Pat. No. 5,246,505 entitled "System and Method To Improve the Power Output and Longevity of a Radioisotope Thermoelectric Generator" issued to Alfred Mowery, Jr. on Sep. 21, 1993 discloses an electrical power source that uses waste heat that is produced by radioactive decays of a highly radioactive material, such as plutonium. The energy in these nuclear decay products is converted into heat that is then converted into electrical energy by conventional methods, such as thermocouples that are distributed around the plutonium source. Unfortunately, the amount of heat involved is so large that the expensive process of helium outgassing is used to cool the radioactive source so that the thermal degradation does not severely degrade apparatus lifetime. Unfortunately, this thermoelectric generator exhibits the disadvantages of the conventional thermoelectric generator designs—namely: very low energy conversion efficiency, expensive manufacture, a large, heavy structure and substantial shielding to prevent health risks caused by the use of a plutonium source, which not only is radioactive, but is also very toxic.

U.S. Pat. No. 5,280,213 entitled "Electric Power Cell Energized By Particle And Electromagnetic Radiation", issued to John Day on Jan. 18, 19945 discloses a power cell that attenuates incident ionization radiation with material that emits slow secondary electrons that charge metallic plates of a capacitor of the type that has a pair of metal plates that are separated by a dielectric material. Although this device exhibits a multiplication factor, the inclusion of dielectric material in a pulsed mode of operation produces significant recombination within the secondary emitter, thereby significantly reducing efficiency.

U.S. Pat. No. 5,605,171 entitled "Porous Silicon With Embedded Tritium As A Stand Alone Prime Power Source For Optoelectronic Applications" discloses a radioluminescent apparatus that is coupled to a photovoltaic cell in which decay energy is converted into light energy. This light energy is then converted by a solar cell into electricity. Although this type of solar cell is fairly reliable, this type of cell has a relatively low energy conversion efficiency, because of its indirect method of energy conversion.

U.S. Pat. No. 5,616,928 entitled "Protecting Personnel And The Environment From Radioactive emissions By Controlling Such Emissions And Safely Disposing Of Their Energy", that was issued to Virginia Russell on Apr. 1, 1997, discloses a converter in which a radioactive source is enclosed within an enclosure formed of metal plates that are separated by dielectric material that forms a capacitive housing that is charged by decay particles. Unfortunately, space charge effects and reverse leakage currents limit the efficiency of this class of embodiments.

U.S. Pat. No. 5,642,014 entitled "Self-Powered Device issued to Steven Hillenius on Jun. 24, 1997 discloses a pn-junction type of isotopic electric converter. This generator includes an integrated circuit that is powered by this converter. This converter is a pn junction type of isotopic converter. This pnjunction is adjacent to a tritium-containing layer that provides β-particles that penetrate the depletion layer and produce electron-hole pairs therein. These electron-hole pairs are separated by the electric field within the depletion layer, thereby producing a current. Unfortunately, like all converters that utilize a pn junction for electrical conversion, the fragile crystalline structure of the semiconductor device is quickly damaged by the bombarding β particles. This eventually destroys this semiconductor device to an extent that severely degrades conversion efficiency. Although such degradation can be slowed by annealing the junction, the rate of degradation of this type of device limits its cost-effectiveness.

Unfortunately, none of the devices can provide increased power generation during intervals of peak power demand. This means that these electrical power generators operate at a level significantly below its peak power level most of the time.

Of the devices discussed above, that convert radioactive decay energy into electricity, none of them has succeeded commercially, because of the deficiencies discussed above. However, because the radioactive decay rate for each of these devices is relatively low, each of these electric power sources provides current at a level that is substantially constant over the time intervals during which most power generators operate.

SUMMARY OF THE INVENTION

A battery is presented that utilizes radioactive decay processes to produce a current through an external load R. Because the battery power is provided by nuclear decays that have very long lifetimes (on the order of the decay half-life of the radioactive material used to produce free ions and electrons in this battery), these batteries have useful lifetimes on the order of the decay half-life of the radioactive material used in these batteries. For example, Americium-241 has a half-life of 458 years and provides decay electrons having 5.5 million electron volt energy. Because the average energy needed to extract a free electron (i.e., its work function) is, on the average, 3.6 volts, these 5.5 million electron volt decay products of Americium-241 can produce on the order of 1,500,000 ions and 1,500,000 free electrons per nuclear decay. This 1,500,000 multiplication factor is incredibly large compared to chemical processes that can release only one or two electrons from an atom or molecule. Its energy is preferably provided by alpha and beta decay processes, so that its radiation is not as penetrating as would be if gamma radiation sources were used.

This battery includes: (I) a first layer of material having a first type of conductivity (e.g., p-type equivalent to the electronegative electrode of a conventional battery, also known as the anode) and an associated work function $W_1$; (II) a second layer of undoped (i.e., intrinsic) material having low conductivity (preferably undoped), containing said radioactive material (that can be gaseous or, preferably, solid), formed on top of said substrate equivalent to the separator, or ion source, in a conventional battery, also known as the electrolyte; and (III) a third layer of material having a second type of conductivity (e.g., n-type equivalent to the electropositive electrode of a conventional battery, also known as the cathode) and an associated work function $W_2$, formed on top of said second layer. The first and third layers are shorted together by a conductor connecting those two layers, so that an electric field is produced in the second layer. Because the first and third layers are much more conductive than the second layer, the voltage drop across the second, low conductivity layer is nearly equal to the difference between the work functions of the first and third layers.

This battery structure provides the following advantages:

- it exhibits the ruggedness that is characteristic of integrated circuits;
- it has an incredibly long useful life;
- a capacitance is easily included in this device to provide a source of quick electrical energy for events requiring a short, high-powered pulse, such as is useful when a motor is first powered; and
- it can be manufactured as part of an integrated circuit, thereby providing a self-powered integrated circuit.

An embodiment is presented that includes an integral capacitor, to store energy for short periods of high power, such as when a motor is first turned on by power provided by this battery.

The highly doped top and bottom surfaces of this battery "lock" the electron bands in place. The benefit of this is that the semiconductor surfaces can then be subjected to damage without degrading battery performance. This facilitates forming ohmic contacts to the semiconductor faces and/or any adjacent oxide layers that have formed on these faces, without impacting device performance. Batteries providing various voltage and power level are readily manufactured. Because the power provided by these batteries is supplied by radioactive materials having lifetimes much longer than human lifetimes, these batteries provide substantially constant voltages over the periods that they are likely to be used.

This battery can draw its energy from a wide variety of radioactive isotopes, utilizing alpha particles, beta particles, gamma particles and/or neutron decay products. Power density is limited by the radiation flux and therefore can be easily varied. In addition, the power provided is determined by the particular radiation source utilized to provide its power. For high power devices, plutonium-238 is a particularly attractive choice because its decay products include particularly high energy decay products.

DESCRIPTION OF THE PREFERRED EMBODIMENTS

Figure 1:
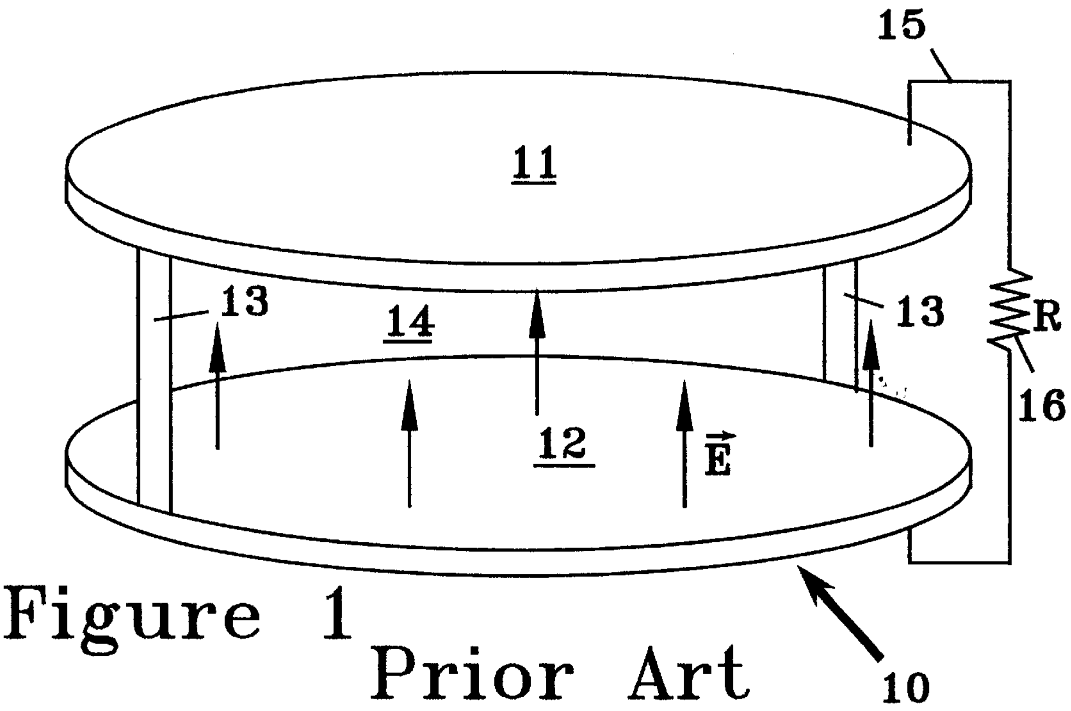
Figure 1 Prior Art
FIG. 1 is a side elevation view, in cross-section, of a prior art isotopic battery in which power is provided by radioactive material that is contained between a pair of electrodes that have different work functions and that are shorted together to produce an electric field in the gap between these electrodes.
Figure 2:
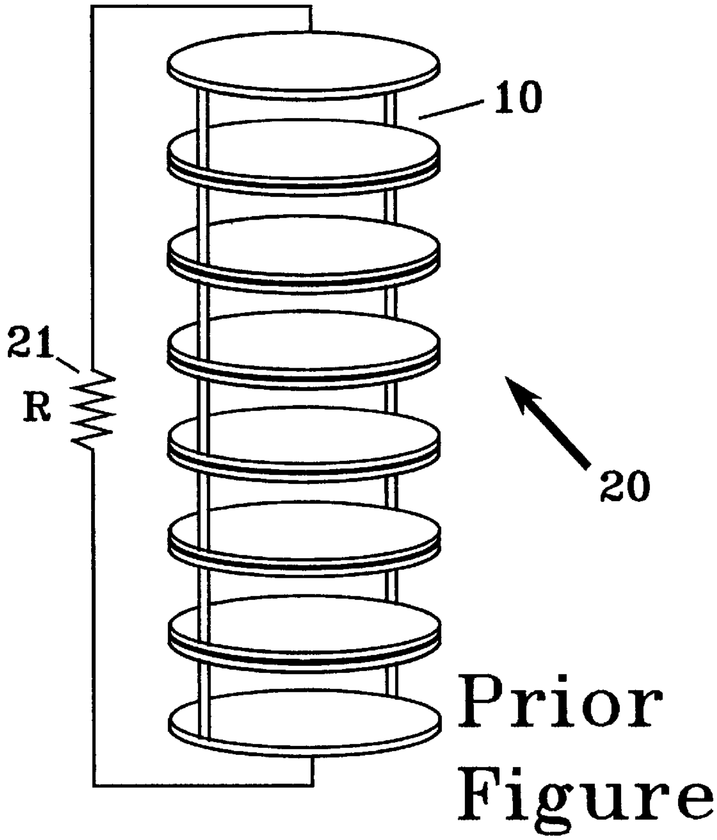
Prior Art Figure 2
FIG. 2 illustrates a prior art stack isotopic battery as in FIG. 1.
Figure 3:
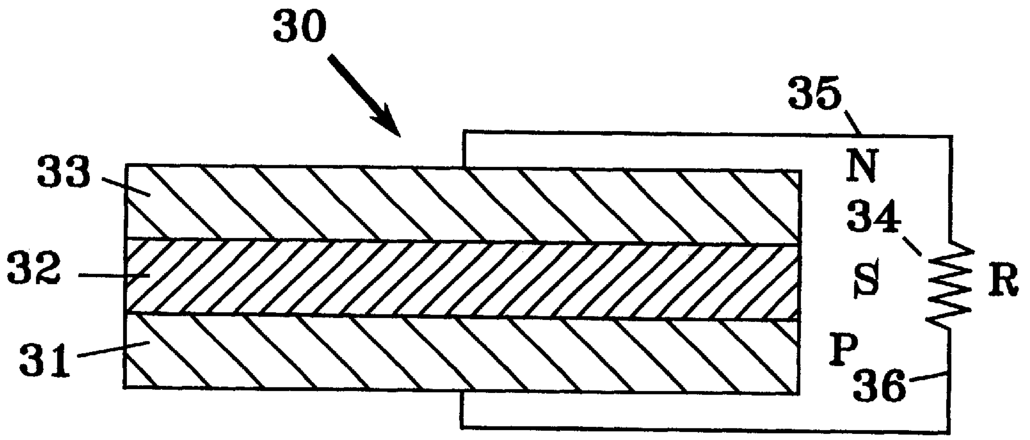
FIG. 3 is a side cross-sectional view of an improved isotopic battery of the type presented in FIG. 1, that is manufactured by integrated circuit processes to produce a more rugged, higher efficiency than the battery presented in U.S. Pat. No. 5,087,533 discussed above.

FIG. 3 is a side cross-sectional view of an improved isotopic battery cell 30, of the type presented in FIG. 1, that is manufactured by integrated circuit processes to produce a more rugged, higher efficiency battery than is presented in U.S. Pat. No. 5,087,533 that is discussed above. This isotopic battery cell 30 contains a p-type substrate 31 having: an intrinsic work function $W_{31}$, a high density of holes; and a thickness on the order of 8 microns (for the embodiment in which the radioactive source is $H^3$). On p-type substrate 31 is deposited an intrinsic semiconductor layer 32 that contains one or more different types of radioactive materials. Deposited on layer 32 is an n-type layer 33 having an intrinsic work function $W_{33}$.

For embodiments in which these p- and n-type layers have comparable doping concentrations, the potential difference between layers 31 and 32 is comparable to the potential difference between layers 32 and 33. This battery provides a voltage that is equal to $W_{31}-W_{33}$. The voltage drops between layers 31 and 32 and between layers 32 and 33 depend on the choices of materials for layers 31, 32 and 33 (because these layers typically have unequal inherent work functions) and on the dopant concentrations in these layers. When the n- and p-type layers have comparable dopant concentrations, the inherent potential differences between layers 31 and 32 and between layers 32 and 33 are comparable. The choices of materials and dopant concentrations can be selected to produce various conventional voltage levels that consumers are expected to utilize, but these choices can also be made to produce values that are optimized for special applications.

The radioactive material in layer 32 produces positive and negative ions by radioactive decay processes. Because of the work function difference $W_{31}-W_{33}$ between between layers 31 and 33, when a closed path is produced through sequential elements 31, 32, 33, 34, 35 and 36, an electric field is produced across layer 32 that pulls the electrons and ions in layer 32 in opposite directions, thereby producing a closed-circuit current that is the sum of the electron and ion currents. The work potential differences of these layers can be selected to produce various battery voltages, such as the conventional 1.5 volt batteries used in a wide variety of electronic devices. For example, one or more of layers 31 and 33 can be an alloy whose constituents and concentrations have been selected to produce a particular zero-current voltage. Likewise, a battery having an integral multiple of a conventional zero-current battery voltages can be produced by manufacturing a battery that is a stack of an integral number of the batteries 30 shown in FIG. 3. These parameter choices can also be made to optimize battery performance for any particular device that is to be battery powered.

Figure 4:
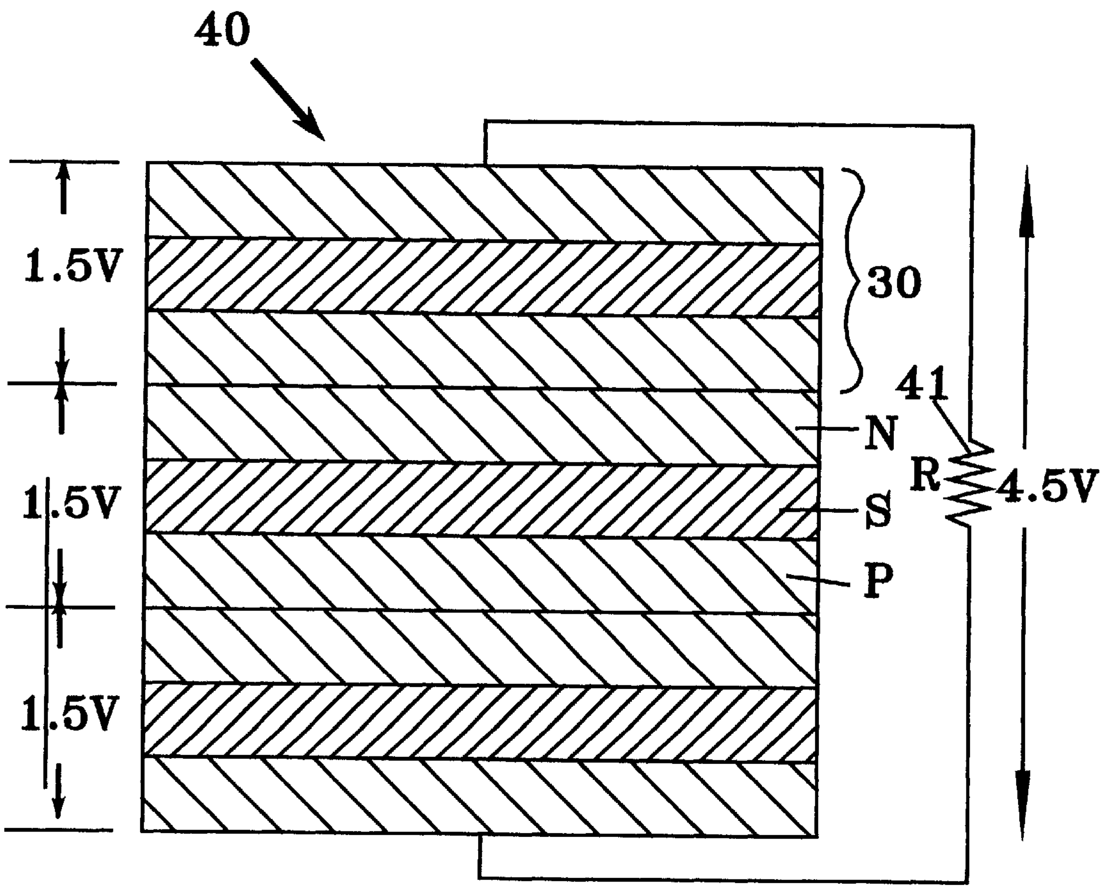
FIG. 4 is a side cross-sectional view of a series stack of three battery cells of the type presented in FIG. 3.

FIG. 4 is a side cross-sectional view of three isotopic batteries 30 of the type shown in FIG. 3, connected in series across a resistive load of resistance R to produce a battery having three times the output voltage of the battery in FIG. 3. Thus, this battery produces an open circuit battery having an output voltage of 4.5 volts.

Figure 5:
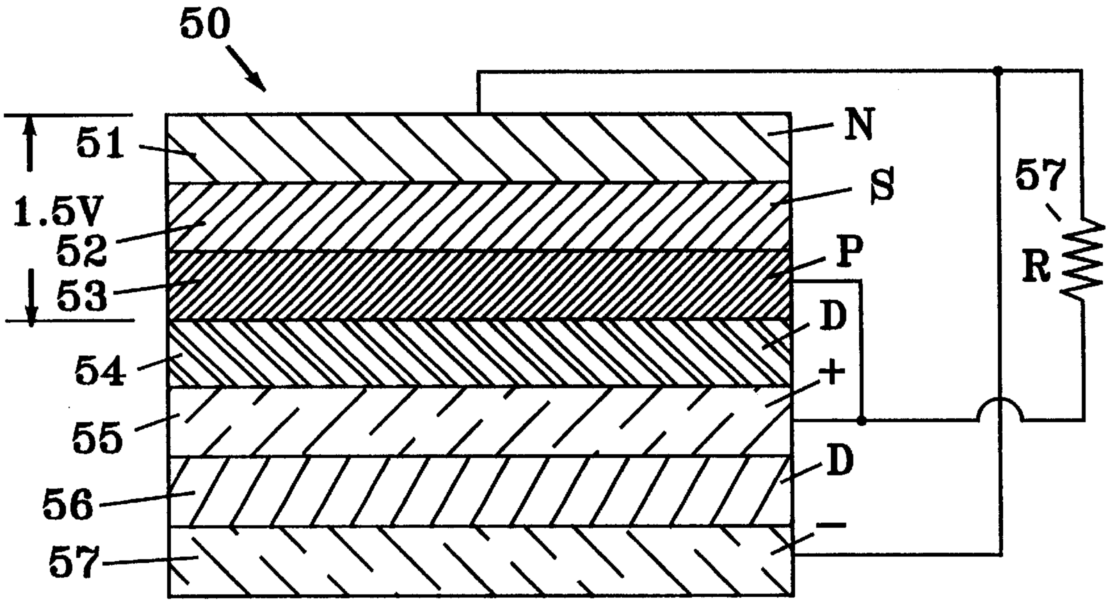
FIG. 5 is a side-cross-sectional view of a battery as in FIG. 3, that includes an integral capacitor to provide quickly-available power.

FIG. 5 is a side cross-sectional view of a battery 50, of the type presented in FIG. 3, that includes a capacitor (55-57), to store electrical energy for peak current demands, such as to start or stop a motor. This battery contains an n-type layer 51, an intrinsic semiconductor layer 52, that contains radioactive material and a p-type layer 53. Layers 51–53 correspond to layers 33, 32 and 31, respectively, of the battery presented in FIG. 3. In addition, this battery contains an insulator layer 54 and a capacitor (55-57) consisting of a positively-charged conductive capacitor plate 55, a dielectric layer 56 and a negatively-charged conductive capacitor plate 57. Insulator layer 54 is included to insulate the capacitor (55-57) from battery (51-53). These thin film conductive layers are easily produced by a thin-film deposition technique, such as ion-sputtering or chemical vapor deposition. The N-type layer 51 is connected to the negatively charged conductive plate 57, which functions as a reservoir for negative charge transferred from n-type layer 51 to conductive plate 57. The P-type layer 53 is connected to the positively charged conductive plate 55, which functions as a reservoir for positive charged transferred from p-type layer 53 to positively-charged layer 55. These reservoirs of charge enable this battery to provide pulses of energy that are useful in applications requiring bursts of power, such as a burst of power to begin moving or rotating an object. For example, when a battery as taught herein is used in a CD player, this reservoir of energy can provide a pulse of power to start a CD ROM rotating hereby providing a faster startup than if such reservoir of energy were not available.

Figure 6:
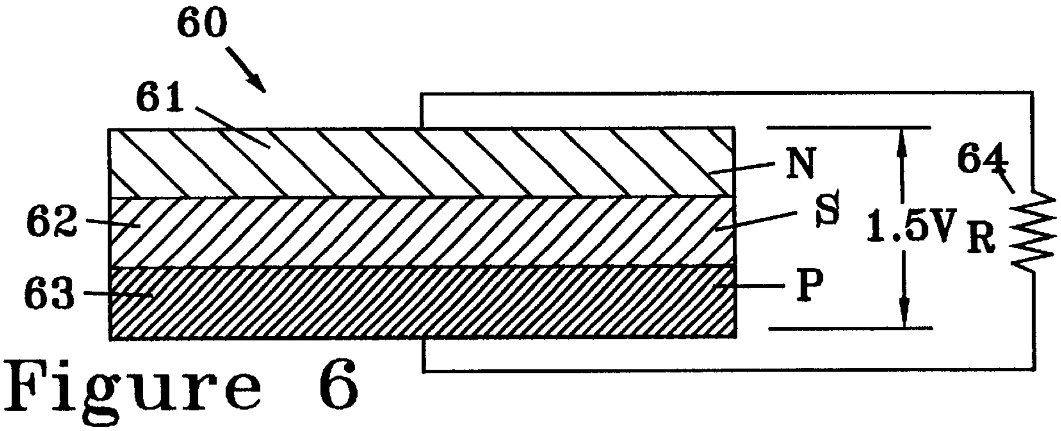
FIG. 6 is a side cross-sectional view of an isotopic battery cell as in FIG. 3 in which one of the plates contains a radioactive isotope that provides decay products to power this battery cell.

FIG. 6 is a side cross-sectional view of an isotopic battery cell as in FIG. 3 in which one of the plates contains a radioactive isotope that provides decay products to power this battery cell.

Although, in the above embodiments, the radioactive material is typically dispersed throughout the layer that contains this radioactive material, this radioactive material can instead be enclosed as thin layer between located between two adjacent layers. For example, any of the embodiments described above can be implemented with the following difference: the layer that would have contained the layer of radioactive material (e.g., tritium), could be formed without containing any radioactive material, and then that layer is cut in half and the radioactive material is applied between the two surfaces produced by this step of cutting this layer. The two cut surfaces are pressed together, thereby trapping the thin layer of radioactive material between these two cut surfaces. A bonding material can be included around the outer edges of the two cut surfaces and/or between these two cut surfaces to bond these cut surfaces together and retain the radioactive material between these two cut surfaces.

Alternatively, the radioactive layer could be in the form of a foil, such as Nickel-63, upon which the semiconductor and electrode layers are deposited by either ion sputtering or vapor deposition without departing from the scope of the present invention. Further, the radioactive layer can be formed onto the amorphous semiconductor layer by ion sputtering or vapor deposition, thereby bonding said radioactive layer to said semiconductor layer.

Advantages of these Types of Battery:

1. This battery can operate at much lower temperatures than a conventional battery, because it does not utilize the liquid storage cells typically used in car batteries or the paste type batteries used in flashlights and toys. This enables these new batteries to operate in frigid polar regions on earth as well as in near absolute zero temperature of outer space.

2. Unlike conventional batteries, such as car batteries that include chemicals that can explode if a short circuit occurs or such as lithium batteries that can ignite if a short circuit occurs, these batteries can be used in a wide range of environments without risk of explosion. Because this battery's power is generated by temperature- and shock-insensitive beta-absorption decay processes instead of by temperature-sensitive chemical processes and shock-sensitive battery structures, these batteries can be utilized in a tremendously wide range of environmental conditions.

3. Because these batteries are powered by radioactive processes that have an extremely long half-life, these batteries, if undamaged, have potential lifetimes on the order of millions of years and have useful lifetimes that are typically caused by damage or environmental factors instead of by loss of internal power.

4. Because the peak power of this battery is limited by the concentration of ionized particles within cavity 14, this battery will not explode and is therefor safer than some convention chemical batteries that can explode when shorted.

5. Because the radioactive decay energies are on the order of millions of electron volts (MeV), these batteries can provide on the order of a million times more energy than a conventional chemical battery of comparable size.

6. Because this battery is produced by integrated circuit processes, it is very rugged, inexpensive and substantially unaffected by vibrations or abrupt accelerations or decelerations.

7. Because the internal resistance is determined by the rate of generation of free electrons and ions by nuclear decays, these batteries will have such a long lifetime that they will appear to provide a constant current zero-load voltage over a useful life that is inherently limited only by environmental conditions and the extraordinarily long half-life of these batteries.

8. Because these batteries are fabricated by integrated circuit processes, they can be manufactured much less expensively than conventional batteries and can be easily implemented on a chip to provide the power for that chip.

9. Because these batteries are produced by conventional integrated circuit fabrication processes, they exhibit a ruggedness that is achievable by integrated circuit fabrication processes. In addition, because they can be manufactured by integrated circuit processes, these batteries can be extremely small.

10. These batteries are ideal for providing power to integrated circuit chips, because they can be manufactured by the same processes used to produce the integrated circuits, thereby enabling the batteries and the integrated circuits to be manufactured by a single fabrication process.

11. The structure of these integrated-circuit batteries produces an inherent capacitance that is very useful during peak power conditions, such as during motor startup or during a peak power demand period.

12. Unlike conventional chemical batteries that can be damaged or even explode when they are shorted, because explosive gases are generated in such batteries, no explosive gases are generated in the batteries presented herein.

13. Because the current in these batteries is limited by the beta particle flux, which in turn is determined by preselected choices of the source of radiation and the quantity of that source, there is no risk of explosions, such as can occur in conventional car batteries that generate explosive gases when they are shorted.

14. The internal resistance of these devices does not vary at a significant rate, because this resistance varies significantly only over the very long half life of the of the radioactive source used to power this battery.

15. Likewise, unlike conventional lead/acid batteries which can have a significant variation in its internal resistance if the battery acid evaporates, the present battery's internal resistance varies at a rate inversely proportional to the half-life of the radioactive material used to power these batteries.

16. The decay half-life of the radioactive materials in these batteries can be tens or even thousands of year or more, depending on the choice of radioactive material used. therefore, these batteries potentially have incredibly long lifetimes. The actual lifetimes will usually be limited by environmental damage instead of by running out of built-in energy levels.

17. These batteries are easily protected from corrosive environments by a hard diamond-like carbon coating that can be applied as part of the chemical vapor deposition manufacturing process.

18. Because these devices are manufactured by integrated circuit fabrication processes, they exhibit the insensitivity to vacuums, high pressure, corrosive atmospheres and impacts that is typical of devices manufactured by integrated circuit process steps.

19. Many different tough, protective coatings, including diamond-like coatings, can be applied by chemical vapor deposition processes to protect these batteries from corrosive atmospheres and vacuums.

20. These batteries can be manufactured as part of an integrated circuit, thereby producing an extremely rugged device that can operate for an incredibly long period that is determined by the ruggedness of the integrated circuit instead of by the lifetime of the battery.

What is claimed is:

1. A battery that utilizes radioactive decay to produce a current through an external load, the battery comprising:

an n-type semiconductor first layer having a first work function, said n-type first layer functioning as a first electrode;

a p-type semiconductor second layer having a second work function that is different from said first work function of said n-type first layer, said p-type second layer functioning as a second electrode, said p-type second layer being in electrical contact with said n-type first layer through the external load;

a thin layer of radioactive semiconductor material located between two adjacent layers of semiconductor material not containing any radioactive material, said thin layer of radioactive semiconductor material and said two adjacent layers of semiconductor material not containing any radioactive material all being located between said n-type first layer and said p-type second layer.

2. The battery of claim 1 wherein the thin layer of radioactive material is tritium.

3. The battery of claim 1 wherein the thin layer of radioactive material is Nickel-63.

* * * * *